(12) United States Patent
Sugita et al.

(10) Patent No.: US 9,093,970 B2
(45) Date of Patent: Jul. 28, 2015

(54) INFORMATION PROCESSING APPARATUS AND INFORMATION PROCESSING METHOD

(75) Inventors: Naoki Sugita, Tokyo (JP); Takashi Tsurumoto, Saitama (JP)

(73) Assignee: Sony Corporation (JP)

( * ) Notice: Subject to any disclaimer, the term of this patent is extended or adjusted under 35 U.S.C. 154(b) by 283 days.

(21) Appl. No.: 13/603,750

(22) Filed: Sep. 5, 2012

(65) Prior Publication Data

US 2013/0064396 A1    Mar. 14, 2013

(30) Foreign Application Priority Data

Sep. 13, 2011 (JP) ................. 2011-199867

(51) Int. Cl.
*H03G 3/00* (2006.01)
*H03G 3/30* (2006.01)
*H04R 3/00* (2006.01)

(52) U.S. Cl.
CPC ............... *H03G 3/3005* (2013.01); *H04R 3/00* (2013.01); *H04R 2430/01* (2013.01)

(58) Field of Classification Search
None
See application file for complete search history.

(56) References Cited

U.S. PATENT DOCUMENTS

2006/0210096 A1*  9/2006  Stokes et al. .................. 381/107
2010/0194561 A1*  8/2010  Motoyama et al. ........... 340/540

FOREIGN PATENT DOCUMENTS

JP          5-250801 A       9/1993
JP          2007306275     * 11/2007

* cited by examiner

*Primary Examiner* — Regina N Holder
(74) *Attorney, Agent, or Firm* — Lerner, David, Littenberg, Krumholz & Mentlik, LLP

(57) ABSTRACT

An information processing apparatus including an audio input unit, an amplifier unit, and a controller. The audio input unit is capable of converting audio into an electric audio signal. The amplifier unit is configured to amplify the audio signal obtained by the audio input unit and capable of performing auto gain control. The controller is configured to turn off the auto gain control of the amplifier unit when an application that uses an audio recognition is executed with respect to the amplified audio signal.

8 Claims, 19 Drawing Sheets

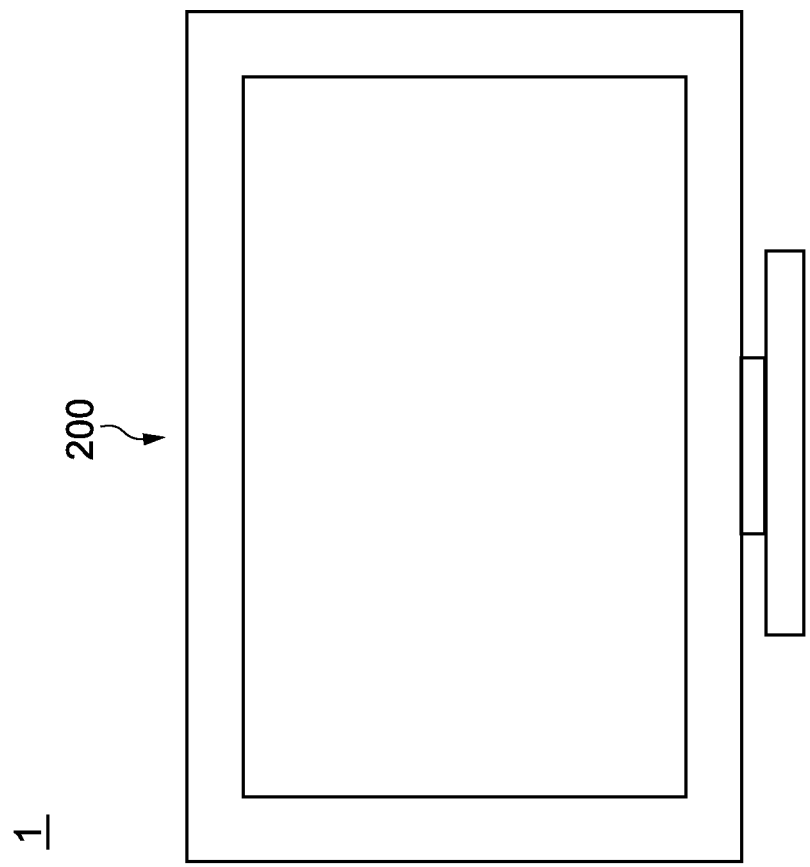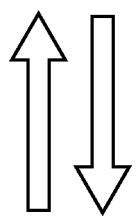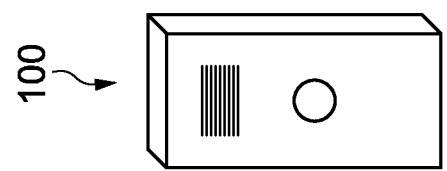

INFORMATION PROCESSING APPARATUS AND INFORMATION PROCESSING METHOD

CROSS-REFERENCE TO RELATED APPLICATION

The present application claims priority from Japanese Patent Application No. JP 2011-199867 filed in the Japanese Patent Office on Sep. 13, 2011, the entire content of which is incorporated herein by reference.

BACKGROUND OF THE INVENTION

The present disclosure relates to an information processing apparatus having a function of performing an audio input using a microphone and an information processing method.

In recent years, a function of performing an audio input using a microphone is adopted in various fields of recording apparatuses, personal computers, cellular phones, and the like. The audio input is used in combination with auto gain control (hereinafter, referred to as AGC) in many cases. For example, in a recording apparatus, an input audio level is adjusted according to recording characteristics such as a dynamic range of a recording medium by the AGC. Moreover, the AGC is used for making all audio including audio from a speaker distant from a microphone and audio from a speaker near the microphone clear during reproduction at a meeting or the like (see, for example, Japanese Patent Application Laid-open No. Hei 5-250801).

SUMMARY OF THE INVENTION

In recent years, there are various apparatuses that are capable of recognizing audio that has been input using a microphone, converting the input audio into data including characters and the like, and processing the converted character string as a command. In such apparatuses, the AGC does not always contribute to an improvement of usability, and the AGC is expected to be improved.

In view of the circumstances as described above, there is a need for an information processing apparatus and an information processing method that have excellent usability.

According to an embodiment of the present disclosure, there is provided an information processing apparatus including: an audio input unit capable of converting audio into an electric audio signal; an amplifier unit that is configured to amplify the audio signal obtained by the audio input unit and capable of performing auto gain control; and a controller configured to turn off the auto gain control of the amplifier unit when an application that uses an audio recognition is executed with respect to the amplified audio signal.

The information processing apparatus according to the embodiment of the present disclosure may further include a first detection unit configured to detect a movement. In this case, the controller may judge, when the auto gain control is off, whether the information processing apparatus is being held by a user based on the detected movement and set a gain corresponding to a result of the judgment to the amplifier unit.

The controller may set, to the amplifier unit, a first gain as the gain when it is judged that the information processing apparatus is being held and set a second gain larger than the first gain as the gain when it is judged that the information processing apparatus is not being held.

The controller may inhibit a switch between the first gain and the second gain during an audio input by the audio input unit.

The information processing apparatus according to the embodiment of the present disclosure may further include a transmission unit configured to transmit the amplified audio signal to an apparatus that executes the application that uses the audio recognition.

The controller may turn on the audio input unit as well as set on/off the auto gain control with respect to the amplifier unit upon receiving an instruction to activate the audio input unit from the apparatus, the instruction including information related to the gain to be set to the amplifier unit.

The information processing apparatus according to the embodiment of the present disclosure may further include a second detection unit configured to detect a tilt. In this case, the controller may judge, when the auto gain control is off, whether the information processing apparatus is being held by a user based on the detected tilt and set a gain corresponding to a result of the judgment to the amplifier unit.

The information processing apparatus according to the embodiment of the present disclosure may further include a cuboidal outer package that has microphone holes related to the audio input unit on one surface thereof, and a third detection unit configured to detect a relationship between a gravity direction and a direction of the surface including the microphone holes. In this case, the controller may request an output of a warning when it is judged by the third detection unit that the gravity direction coincides with the direction of the surface including the microphone holes while the auto gain control is off.

The information processing apparatus according to the embodiment of the present disclosure may further include a cuboidal outer package in which microphone holes related to the audio input unit and an operator operated during an audio input are provided on one surface while being apart from each other in a uniaxial direction, and a fourth detection unit configured to detect a positional relationship between the microphone holes and the operator in a gravity direction. In this case, the controller may request an output of a warning when it is judged by the fourth detection unit that the microphone holes are located more on the gravity direction side than the operator while the auto gain control is off.

According to another embodiment of the present disclosure, there is provided an information processing method including: converting, by an audio input unit, audio into an electric audio signal; amplifying, by an amplifier unit capable of performing auto gain control, the audio signal obtained by the audio input unit; and turning off, by a controller, the auto gain control of the amplifier unit when an application that uses an audio recognition is executed with respect to the amplified audio signal.

As described above, according to the embodiments of the present disclosure, an information processing apparatus and an information processing method that have excellent usability can be provided.

These and other objects, features and advantages of the present disclosure will become more apparent in light of the following detailed description of best mode embodiments thereof, as illustrated in the accompanying drawings.

BRIEF DESCRIPTION OF THE DRAWINGS

FIG. 1 is a diagram showing an information processing system according to a first embodiment of the present disclosure;

DETAILED DESCRIPTION OF EMBODIMENTS

Hereinafter, an embodiment of the present disclosure will be described with reference to the drawings.
<First Embodiment>
[Information Processing System]

FIG. 1 is a diagram showing an information processing system according to a first embodiment of the present disclosure.

The information processing system 1 includes a wireless operation terminal 100 (information processing apparatus) as a remote controller and an apparatus (hereinafter, referred to as "operation target apparatus") 200 as an operation target of the wireless operation terminal 100. The operation target apparatus 200 may be, for example, a television receiver (hereinafter, referred to as TV), a personal computer, a recording apparatus, a reproduction apparatus, or a game machine. The information processing system 1 may be used as a TV phone using an audio input made via a microphone of the wireless operation terminal 100 and a display and speaker of the operation target apparatus 200.

As the wireless operation terminal 100, particularly a terminal to which a user voice and the like can be input using a microphone is used in the present disclosure. Audio that has been input to the wireless operation terminal 100 using a microphone is converted into electric signals and transmitted to the operation target apparatus 200 via a wireless medium. The operation target apparatus 200 carries out an audio recognition with respect to the audio signals transmitted from the wireless operation terminal 100 and hands them over to other processing such as recording processing and command processing as data including characters.

[Hardware Structure of Wireless Operation Terminal]

Figure 2:
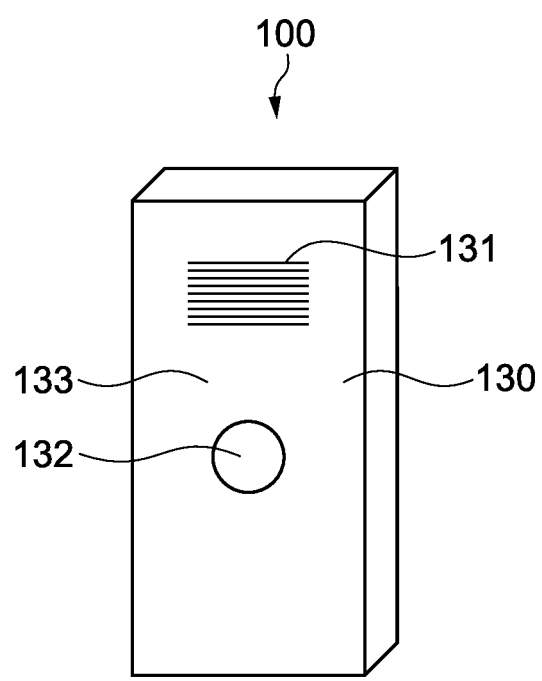
FIG. 2 is a diagram showing an outer appearance of a wireless operation terminal shown in FIG. 1.

FIG. 2 is a diagram showing an outer appearance of the wireless operation terminal 100.

The wireless operation terminal 100 includes a cuboidal outer package 130. Various electronic components constituting the wireless operation terminal 100 are incorporated into the outer package 130. Microphone holes 131 are formed on one main surface 133 of the outer package 130. Acoustic waves are transmitted as air transmission sounds to a microphone (see FIG. 3) as an audio input unit incorporated into the outer package 130 via the microphone holes 131. A microphone ON button 132 is also provided on the outer package 130. While the microphone ON button 132 is pressed after receiving a microphone ON notification from the operation target apparatus 200, an amplifier unit that amplifies acoustic waves captured by the microphone is turned on, an A/D conversion is performed with respect to amplified audio signals, and the digital audio signals are transmitted to the operation target apparatus 200 by wireless communication.

It should be noted that it is also possible for the audio input to be performed even when the microphone ON button 132 is not pressed, after receiving a microphone ON notification from the operation target apparatus 200. Alternatively, it is also possible for the audio input to be performed when a change of an acceleration detected by the wireless operation terminal 100 becomes equal to or larger than a threshold value. Also in this case, the audio input may be performed even when the microphone ON button 132 is not pressed.

Figure 3:
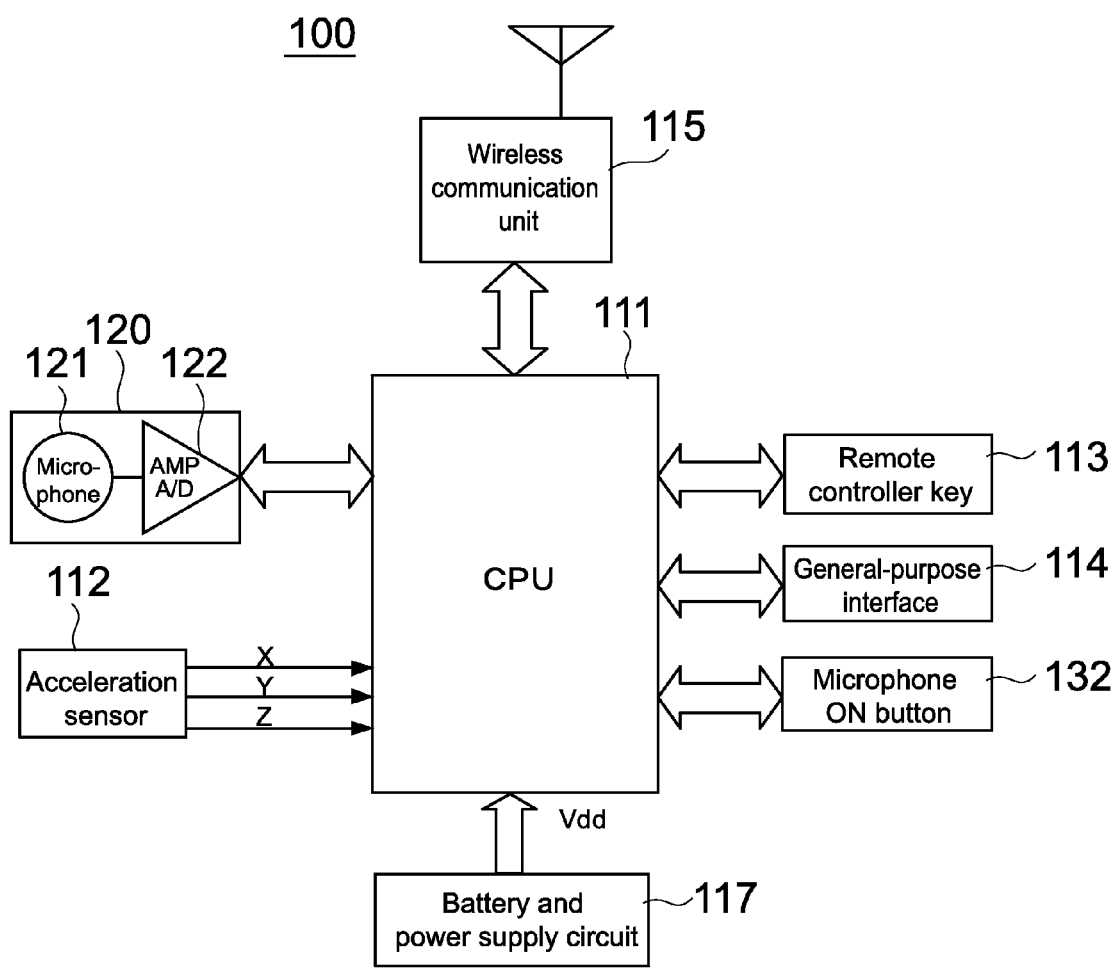
FIG. 3 is a block diagram showing a hardware structure of the wireless operation terminal shown in FIG. 1.

FIG. 3 is a block diagram showing a hardware structure of the wireless operation terminal 100.

The wireless operation terminal 100 includes a CPU 111, an acceleration sensor 112, a remote controller key 113, a general-purpose interface 114, a wireless communication unit 115, the microphone ON button 132, a battery and power supply circuit 117, and a microphone unit 120.

The CPU 111 performs overall control of the blocks constituting the wireless operation terminal 100 and controls various types of operational processing and data exchanges among the blocks.

The acceleration sensor 112 detects accelerations in triaxial XYZ directions for detecting a position, movement, and the like of the wireless operation terminal 100 and supplies the accelerations to the CPU 111. The CPU 111 A/D-converts and takes in the triaxial outputs from the acceleration sensor 112.

The remote controller key 113 includes a plurality of keys to which various commands for operating the operation target apparatus 200 are allocated.

The general-purpose interface 114 is an interface capable of reading and writing data from and to a removable medium for upgrading firmware, for example. Specifically, the general-purpose interface 114 is a USB interface, though not particularly limited thereto in the present disclosure.

The microphone unit 120 is mainly used to collect user voices. The microphone unit 120 captures audio, converts the audio into electric signals, and supplies the signals to the CPU 111. More specifically, the microphone unit 120 includes a microphone 121 and an amplification A/D conversion circuit 122 that amplifies an output of the microphone 121.

The wireless communication unit 115 holds bidirectional wireless signal communication with the operation target apparatus 200. As a wireless communication system, there are an IR (Infrared Ray) system, an RF system such as RF4CE (Radio Frequency for Consumer Electronics) as an international standard for household RF remote controllers, a wireless LAN conforming to an IEEE (registered trademark) (Institute of Electrical and Electronic Engineers) 802.11b standard as a near field communication standard, and the like.

The battery and power supply circuit 117 generates voltages usable in the CPU 111 from battery power and supplies them to the CPU 111.

It should be noted that as means for detecting a position or movement of the wireless operation terminal 100, there is a gyro sensor or the like in addition to the acceleration sensor 112. Alternatively, there is a method of taking a video of a periphery seen from the wireless operation terminal 100 using a camera (not shown) and analyzing the taken image in the CPU 111 of the wireless operation terminal 100, a CPU 201 of the operation target apparatus 200, or the like, to thus detect a position or movement of the wireless operation terminal 100.

[Hardware Structure of Operation Target Apparatus]

Figure 4:
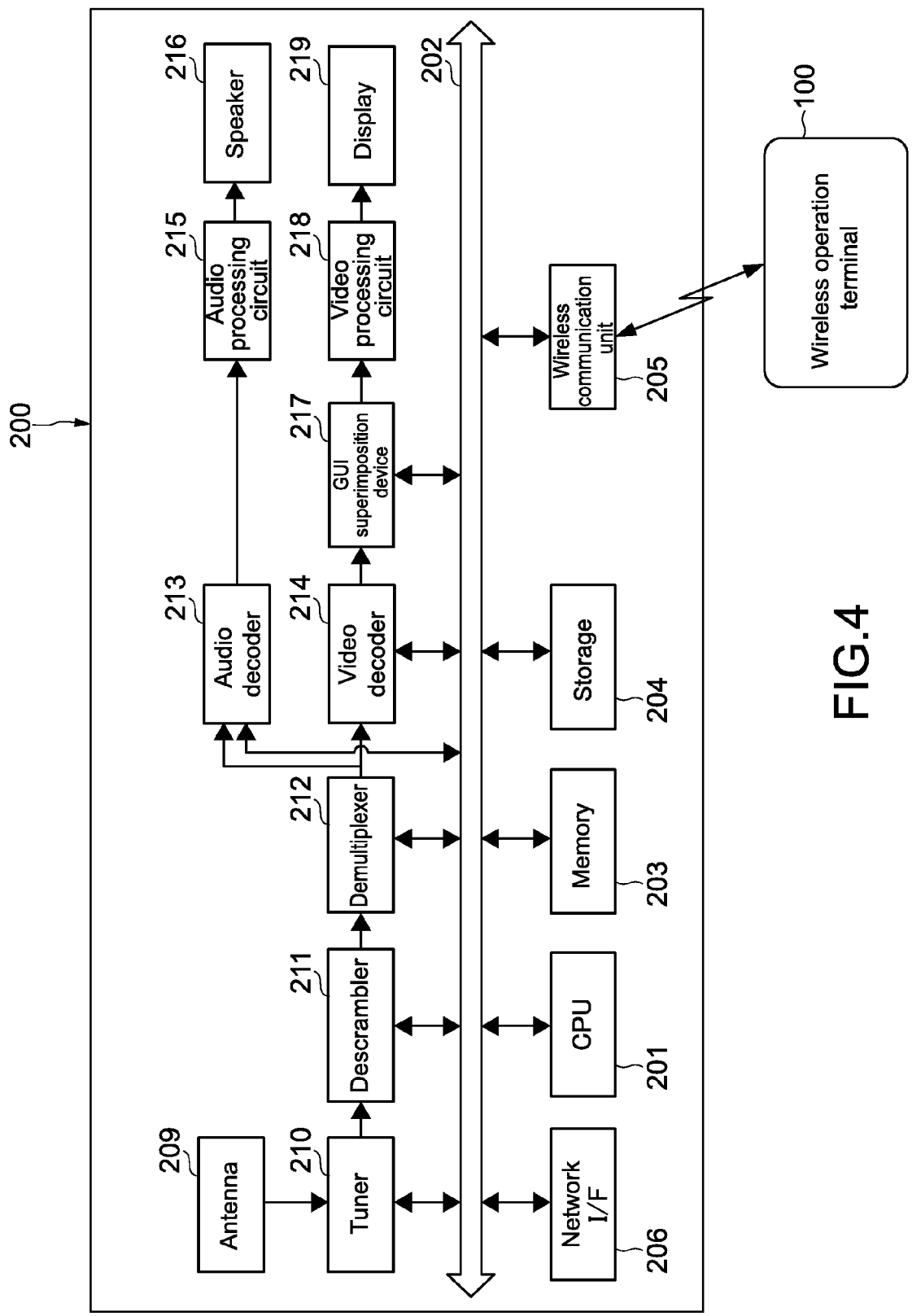
FIG. 4 is a block diagram showing a hardware structure of an operation target apparatus shown in FIG. 1.

FIG. 4 is a block diagram showing a hardware structure of the operation target apparatus 200.

Although a television receiver is used as the operation target apparatus 200 in this embodiment, the type of the operation target apparatus is not limited to a television receiver in the present disclosure. For example, a personal computer, a game machine, a recording apparatus, or a reproduction apparatus may be used.

The operation target apparatus 200 includes the CPU 201, a bus 202, a memory 203, a storage 204, a wireless communication unit 205, and a network I/F 206. The operation target apparatus 200 also includes an antenna 209, a tuner 210, a descrambler 211, a demultiplexer 212, an audio decoder 213, a video decoder 214, an audio processing circuit 215, a speaker 216, a GUI (Graphical User Interface) superimposition device 217, a video processing circuit 218, and a display 219.

In the operation target apparatus 200, the CPU 201 executes various types of processing according to programs stored in the memory 203 or storage 204 connected thereto via the bus 202. The CPU 201 also receives a wireless signal input by the wireless operation terminal 100 via the wireless communication unit 205 as a command. The CPU 201 controls operations of the respective units according to the commands.

The wireless communication unit 205 holds bidirectional signal communication with the wireless operation terminal 100.

The antenna 209 receives digital broadcast signals and the like and inputs them to the tuner 210.

The tuner 210 extracts broadcast signals of a predetermined channel (e.g., channel designated by user via wireless operation terminal 100) from the digital broadcast signals. The tuner 210 outputs a transport stream of the predetermined channel obtained by carrying out demodulation processing on the extracted broadcast signals to the descrambler 211.

Using a predetermined cancel key, the descrambler 211 cancels a scramble of the transport stream input from the tuner 210. The descrambler 211 outputs the scramble-canceled transport stream to the demultiplexer 212.

The demultiplexer 212 separates audio data and video data from the scramble-canceled transport stream input from the descrambler 211. The demultiplexer 212 outputs the separated audio data to the audio decoder 213 and the separated video data to the video decoder 214.

The audio decoder 213 decodes the audio data input from the demultiplexer 212 and outputs the obtained electric signals to the audio processing circuit 215.

The audio processing circuit 215 carries out D/A (Digital/Analog) conversion processing, amplification processing, and the like on the electric signals input from the audio decoder 213 and outputs the obtained audio signals to the speaker 216.

The video decoder 214 decodes the video data input from the demultiplexer 212 and outputs the obtained video data to the GUI superimposition device 217.

The GUI superimposition device 217 superimposes graphic data of OSD (On Screen Display) and the like on the video data input from the video decoder 214 and outputs it to the video processing circuit 218.

The video processing circuit 218 carries out predetermined image processing, D/A (Digital/Analog) conversion processing, and the like on the video data input from the GUI superimposition device 217 and outputs the obtained video signals to the display 219.

Further, the CPU 201 is capable of similarly receiving digital broadcast signals based on an operation to the wireless operation terminal 100 to obtain a transport stream of a predetermined channel, and storing it in the storage 204 as electric video signals of a program.

The CPU 201 is also capable of carrying out processing for setting a microphone gain of the wireless operation terminal 100 based on a program stored in the memory 203, for example.

[Functional Structure of Operation Target Apparatus 200]

Figure 5:
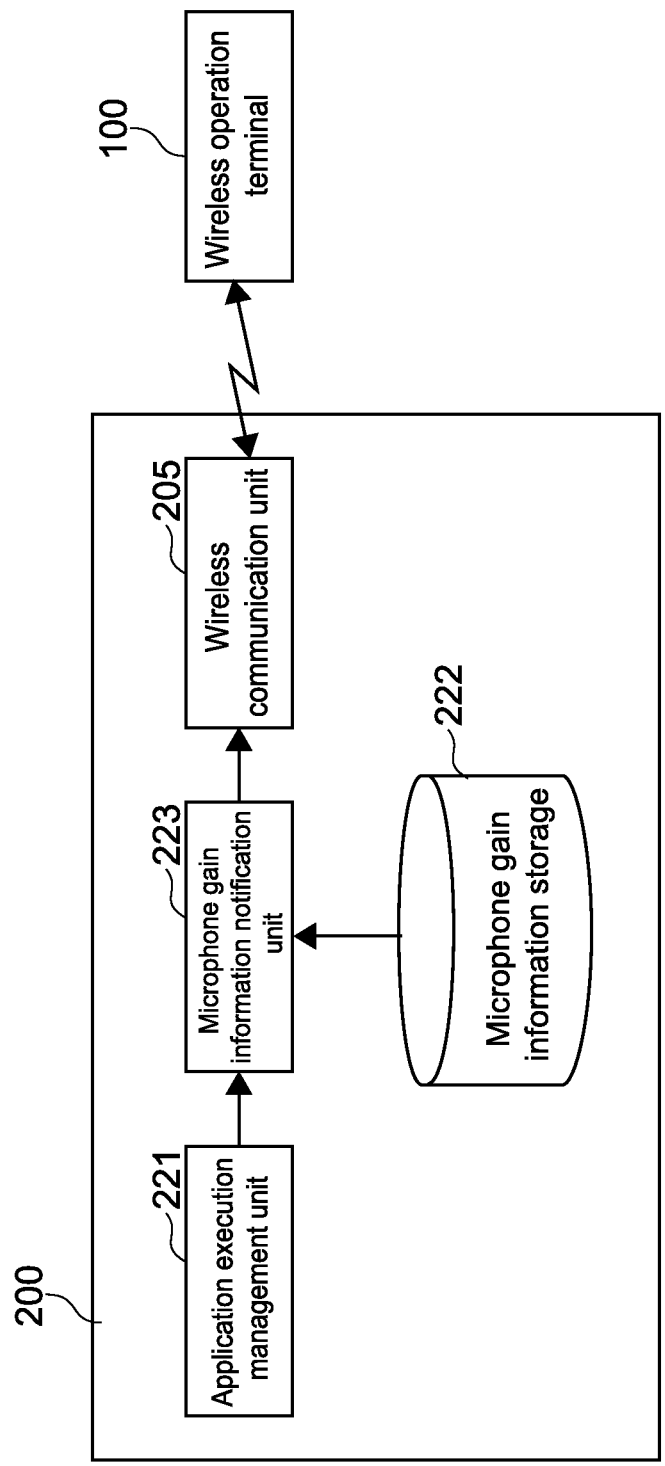
FIG. 5 is a block diagram showing a functional structure of the operation target apparatus shown in FIG. 1.

FIG. 5 is a block diagram showing a functional structure of the operation target apparatus 200 related to the microphone gain setting processing. Here, an application execution management unit 221, a microphone gain information storage 222, and a microphone gain information notification unit 223 are realized by the CPU 201 of the operation target apparatus 200 executing programs stored in the memory.

The application execution management unit 221 is a module that manages an execution of an application program (hereinafter, referred to as "application") related to audio processing. The application program may be an application loaded into the operation target apparatus 200 or an application on a web usable via a browser.

There are, for example, the following applications as the application related to audio processing that is executed in the operation target apparatus 200.

1. An application for acquiring audio data input from the wireless operation terminal 100 via the microphone 121, generating data including a character string by carrying out an audio recognition, supplying the data to a search application on a web, for example, as a search key, and receiving a response thereto.

2. An application for acquiring audio data input from the wireless operation terminal 100 via the microphone 121 and recording the audio data in the storage 204 or the like or transmitting it to other apparatuses via a transmission path such as a network.

Hereinafter, the application of Item 1 will be referred to as "application that uses audio recognition", and the application of Item 2 will be referred to as "application that does not use audio recognition".

The microphone gain information storage 222 is an area where microphone gain information of each of the applications is stored in advance. In the hardware structure shown in FIG. 4, the microphone gain information storage 222 is set in, for example, the storage 204. Alternatively, a partial area in a ROM (not shown) may be used as an application storage. Alternatively, microphone gain information may be stored in other apparatuses connected via a network.

The microphone gain information is information related to a gain of the amplification A/D conversion circuit 122 in the microphone unit 120 of the wireless operation terminal 100. As the microphone gain information, there are information that designates AGC to be turned on and information that designates a gain value by turning off the AGC. In this embodiment, with respect to the application that does not use the audio recognition, the "information that designates the AGC to be turned on" is set in the microphone gain information storage 222 as the microphone gain information. Moreover, with respect to the application that uses the audio recognition, the "information that designates a gain value by turning off the AGC" is set in the microphone gain information storage 222 as the microphone gain information. It should be noted that the gain value with respect to the application that uses the audio recognition is not limited to one type, and a plurality of types of gain values corresponding to various conditions on the wireless operation terminal 100 side such as a detection result of a state of the wireless operation terminal 100 while being operated (holding state/unheld state) may be prepared. Further, when there are a plurality of applications that use the audio recognition, a gain value optimal for each application may be set.

The microphone gain information notification unit 223 reads, according to a type of the activated application, the microphone gain information set to the application from the microphone gain information storage 222 and transmits a microphone ON command including the microphone gain information to the wireless operation terminal 100.

[Functional Structure of Wireless Operation Terminal 100]

Next, a functional structure of the wireless operation terminal 100 that operates in association with the microphone gain setting processing of the operation target apparatus 200 will be described.

Figure 6:
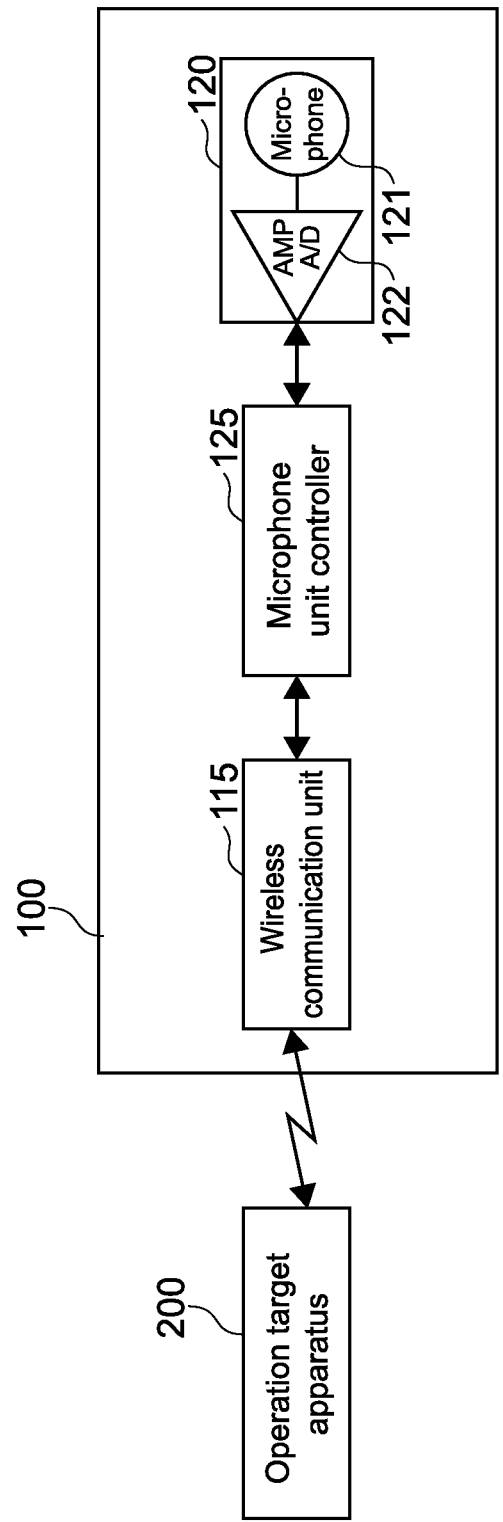
FIG. 6 is a block diagram showing a functional structure of the wireless operation terminal shown in FIG. 1.

FIG. 6 is a block diagram showing a functional structure of the wireless operation terminal 100. Such a functional structure is realized by the CPU 111 of the wireless operation terminal 100 executing a program stored in the memory.

The wireless operation terminal 100 includes a microphone unit controller 125.

Upon receiving a microphone ON request including the microphone gain information, that has been notified by the microphone gain information notification unit 223 of the operation target apparatus 200 via the wireless communication unit 115, the microphone unit controller 125 carries out processing for turning on/off the AGC of the amplification A/D conversion circuit 122 of the microphone unit 120 and processing for setting a gain at a time the AGC is OFF and turning on the microphone unit 120, based on the microphone gain information included in the microphone ON request.

[Operations of Information Processing System]

Next, operations of the wireless operation terminal 100 and the operation target apparatus 200 constituting the information processing system 1 will be described. [1. Case where application that does not use audio recognition is operated]

Figure 7:
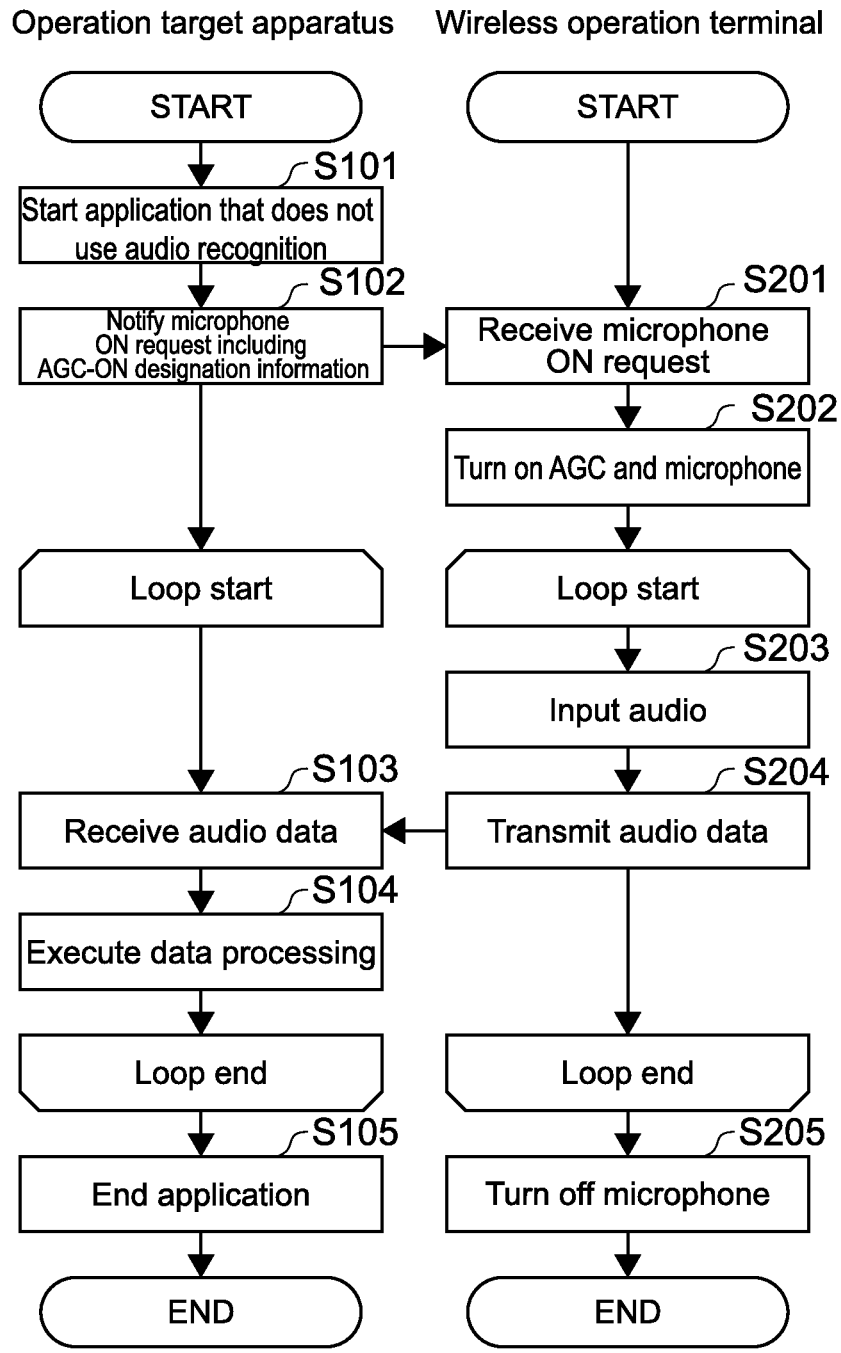
FIG. 7 is a flowchart showing operations of the wireless operation terminal and the operation target apparatus in a case where an application that does not use an audio recognition is executed in the information processing system shown in FIG. 1.

FIG. 7 is a flowchart showing operations of the wireless operation terminal 100 and the operation target apparatus 200 in a case where the application that does not use the audio recognition is executed.

When the application that does not use the audio recognition is activated in the operation target apparatus 200 (Step S101), the microphone gain information notification unit 223 of the operation target apparatus 200 receives a notification notifying that the application has been activated from the application execution management unit 221. Upon receiving the notification, the microphone gain information notification unit 223 reads out microphone gain information preset with respect to the application from the microphone gain information storage 222. Here, the microphone gain information that has been preset with respect to the application that does not use the audio recognition is constituted of information that designates the AGC to be turned on. The microphone gain information notification unit 223 notifies the wireless operation terminal 100 of a microphone ON request including the information that designates the AGC to be turned on using the wireless communication unit 205 (Step S102).

Upon receiving the microphone ON request (Step S201), the microphone unit controller 125 of the wireless operation terminal 100 turns on the microphone unit 120 in a state where the AGC of the amplification A/D conversion circuit 122 in the microphone unit 120 is set to ON based on the information that designates the AGC to be turned on, that is included in the microphone ON request (Step S202). Accordingly, audio is input in a state where the AGC of the amplification A/D conversion circuit 122 in the microphone unit 120 is set to ON (Step S203). After that, the CPU 111 of the wireless operation terminal 100 transmits the audio data obtained by the microphone unit 120 to the operation target apparatus 200 using the wireless communication unit 115 (Step S204).

Upon receiving the audio data wirelessly transmitted from the wireless operation terminal 100 (Step S103), the CPU 201 of the operation target apparatus 200 carries out, based on the application, processing that does not use an audio recognition with respect to the audio data, such as processing for recording the audio data onto a recording medium or transmitting it to another apparatus (Step S104).

After executing the data processing, the CPU 201 of the operation target apparatus 200 ends the application when any of the following conditions is satisfied, for example (Step S105).

1. When an application end notification is transmitted from the wireless operation terminal 100.

2. When an input of audio data from the wireless operation terminal 100 is stopped for a certain period of time On the other hand, upon detecting that the microphone ON button 132 has been switched from ON to OFF, the microphone unit controller 125 of the wireless operation terminal 100 turns off the microphone unit 120 and instructs the wireless operation terminal 100 to end the application. Alternatively, the CPU 111 turns off the microphone unit 120 upon receiving a microphone OFF instruction from the operation target apparatus 200 (Step S205).

[2. Case where Application that Uses Audio Recognition is Operated]

Figure 8:
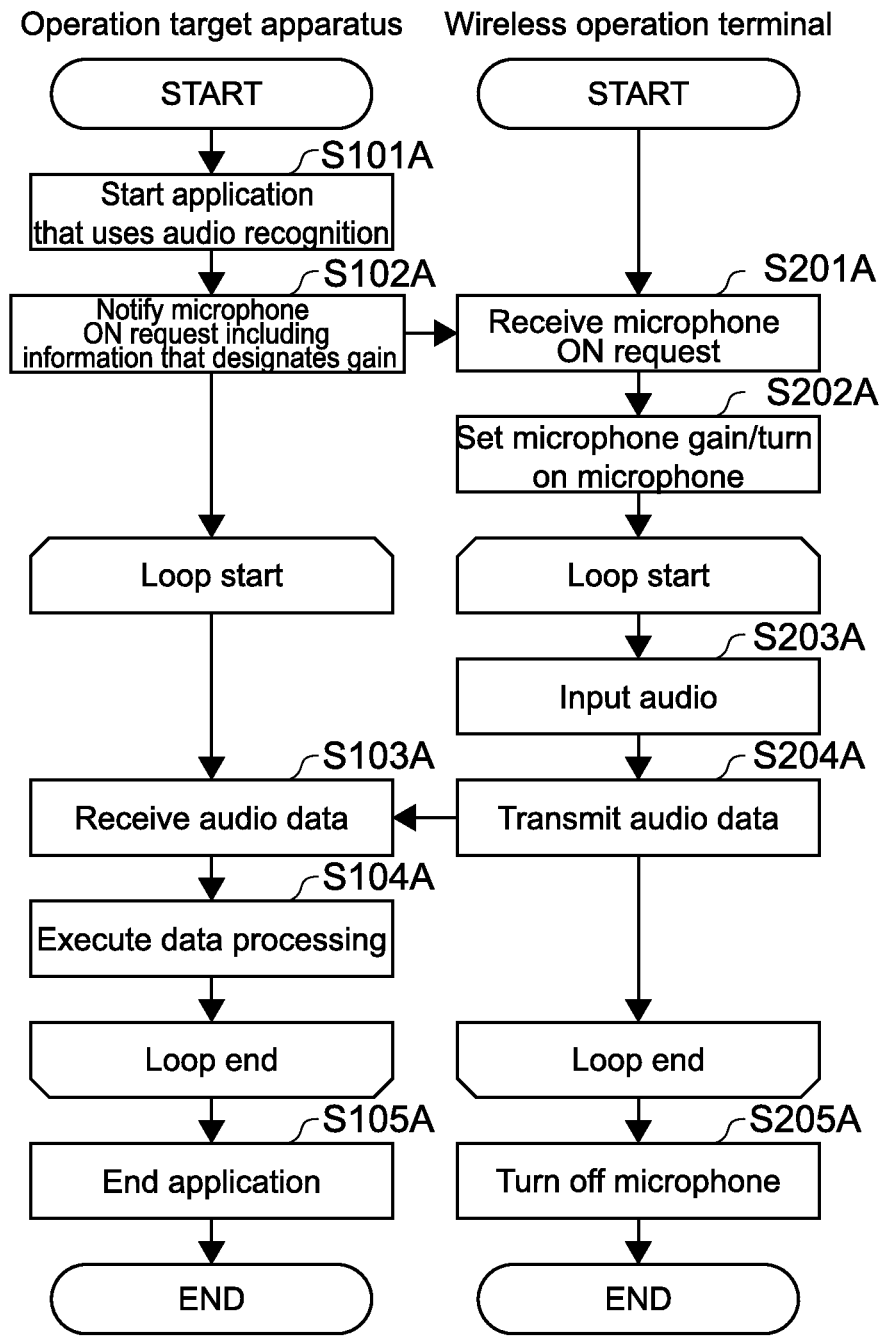
FIG. 8 is a flowchart showing operations of the wireless operation terminal and the operation target apparatus in a case where an application that uses an audio recognition is executed in the information processing system shown in FIG. 1.

FIG. 8 is a flowchart showing operations of the wireless operation terminal 100 and the operation target apparatus 200 in a case where the application that uses the audio recognition is operated.

When the application that uses the audio recognition is activated in the operation target apparatus 200 (Step S101A), the microphone gain information notification unit 223 of the operation target apparatus 200 receives a notification notifying that the application has been activated from the application execution management unit 221. Upon receiving the notification, the microphone gain information notification unit 223 reads out microphone gain information preset with respect to the application from the microphone gain information storage 222. Here, the microphone gain information that has been preset with respect to the application that uses the audio recognition is constituted of information that designates a gain value by turning off the AGC. The microphone gain information notification unit 223 notifies the wireless operation terminal 100 of a microphone ON request including the information that designates a gain value by turning off the AGC using the wireless communication unit 205 (Step S102A).

Upon receiving the microphone ON request (Step S201A), the microphone unit controller 125 of the wireless operation terminal 100 turns on the microphone unit 120 in a state where a gain of the amplification A/D conversion circuit 122 in the microphone unit 120 is set based on the information that designates a gain value, that is included in the microphone ON request (Step S202A). Accordingly, audio is input in a state where the gain preset with respect to the application is set to the amplification A/D conversion circuit 122 in the microphone unit 120 (Step S203A). After that, the CPU 111 of the wireless operation terminal 100 transmits the audio data obtained by the microphone unit 120 to the operation target apparatus 200 using the wireless communication unit 115 (Step S204A).

Upon receiving the audio data wirelessly transmitted from the wireless operation terminal 100 (Step S103A), the CPU 201 of the operation target apparatus 200 carries out, based on the application, an audio recognition on the audio data and executes data processing such as a web search using data including a character string obtained by the audio recognition as a search keyword (Step S104A).

As described above, according to this embodiment, when the application that uses the audio recognition is executed, the AGC of the microphone unit 120 of the wireless operation terminal 100 is turned off, and a gain preset to the application that uses the audio recognition is set to the amplification A/D conversion circuit 122 of the microphone unit 120. As a result, recognition errors due to errors in a pattern matching for the audio recognition can be lessened.

It should be noted that in this embodiment, the operation target apparatus 200 notifies the wireless operation terminal 100 of the microphone gain information corresponding to the activated application. However, the present disclosure is not limited thereto, and the operation target apparatus 200 may notify information on the activated application so that the microphone unit controller 125 of the wireless operation terminal 100 can judge the corresponding microphone gain information to turn on/off the AGC of the amplification A/D conversion circuit 122 of the microphone unit 120 or set a gain when the AGC is OFF, based on the information on the application. In this case, a storage corresponding to the microphone gain information storage 222 shown in FIG. 5 needs to be provided in the wireless operation terminal 100. The microphone unit controller 125 receives a microphone ON request including the information on the activated application from the operation target apparatus 200 and acquires, based on the information on the application included in the microphone ON request, relevant microphone gain information from the storage that stores microphone gain information.

MODIFIED EXAMPLE 1

Next, as Modified Example 1 of the above embodiment, a method of varying a gain depending on whether the wireless operation terminal 100 is being held by a user when the application that uses the audio recognition is executed in the operation target apparatus 200 will be described.

Figure 9:
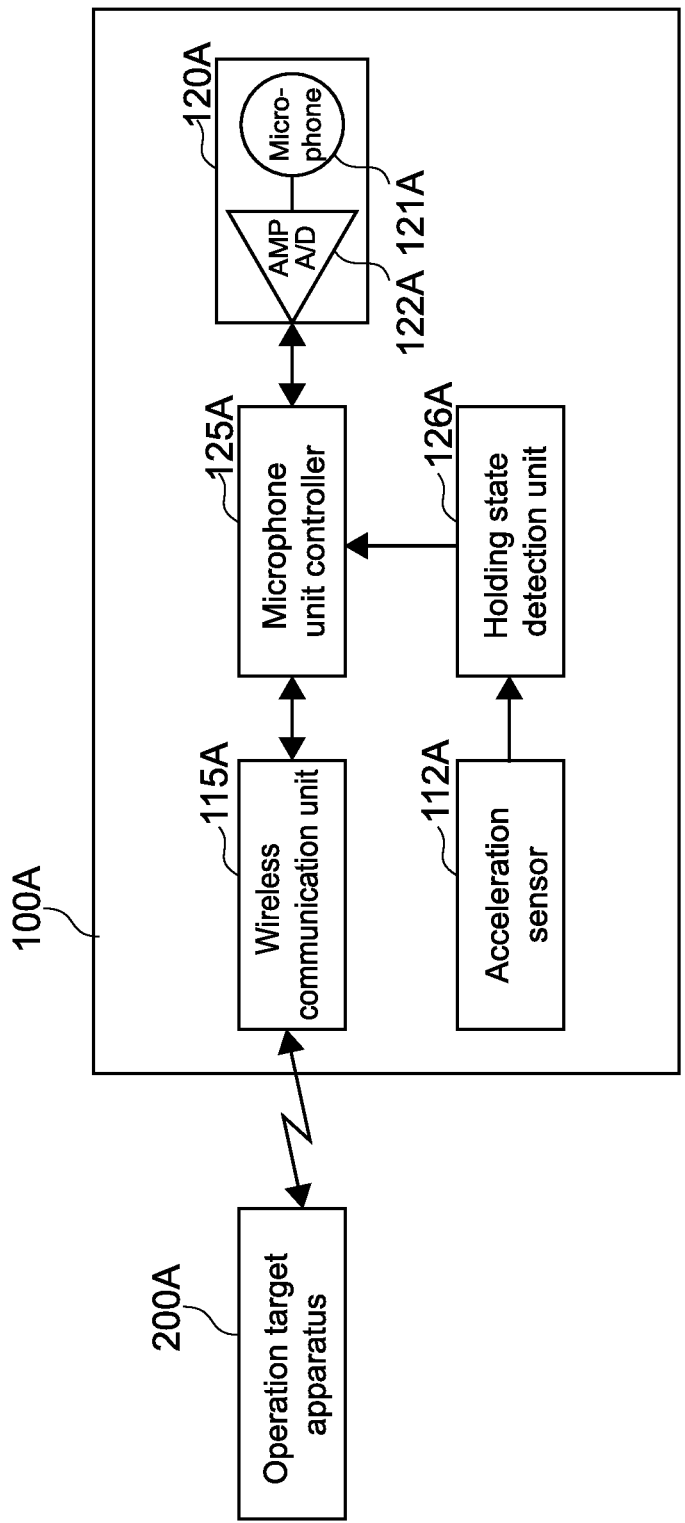
FIG. 9 is a block diagram showing a functional structure of a wireless operation terminal according to Modified Example 1.
Figure 10:
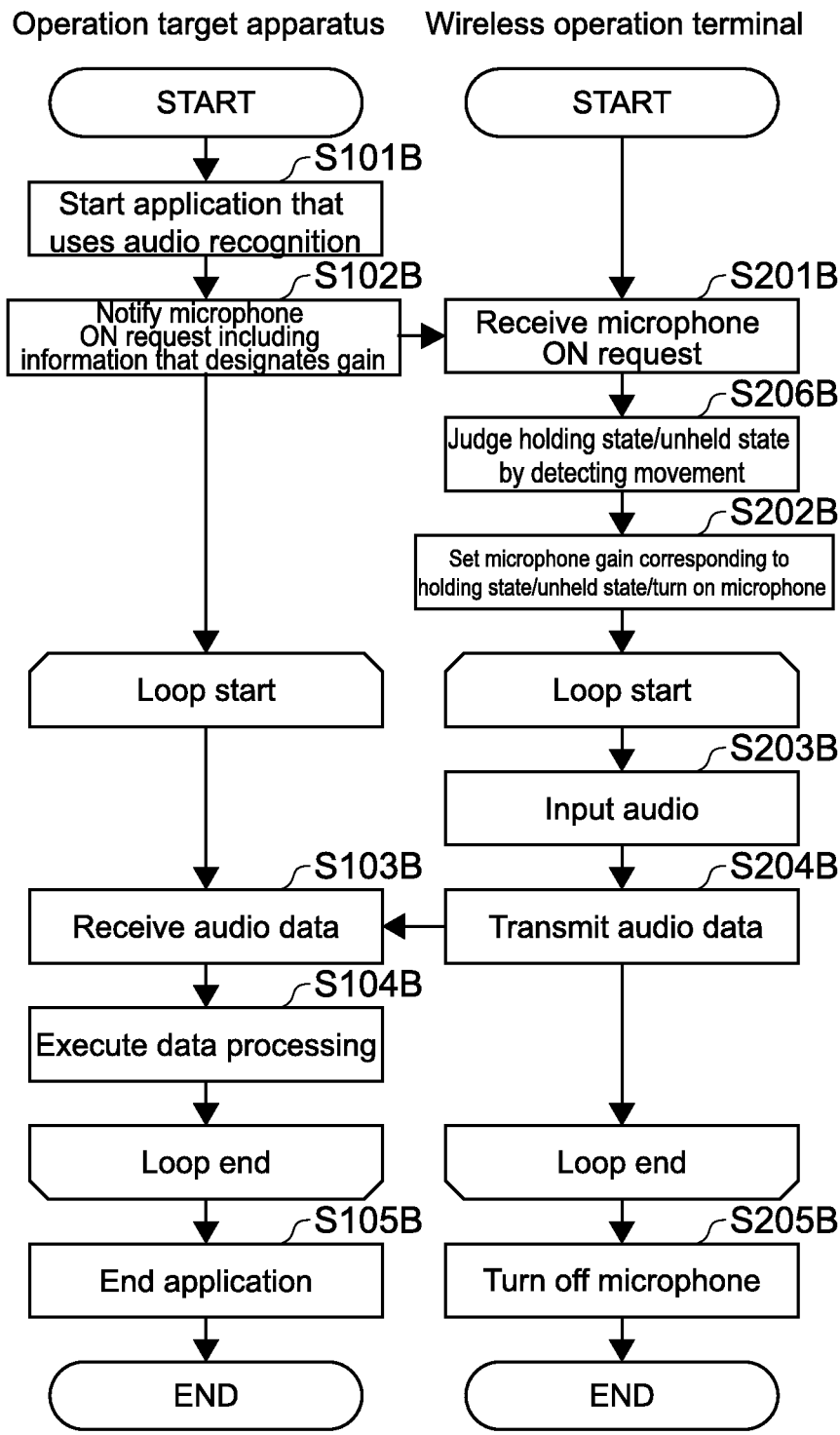
FIG. 10 is a flowchart showing operations of the wireless operation terminal and the operation target apparatus according to Modified Example 1.

FIG. 9 is a block diagram showing a functional structure of a wireless operation terminal 100A according to Modified Example 1. FIG. 10 is a flowchart showing operations of the wireless operation terminal 100A and an operation target apparatus 200A according to Modified Example 1.

In FIG. 9, a holding state detection unit 126A is a module that judges whether the wireless operation terminal 100A is being held based on a detection result obtained by an acceleration sensor 112A. The holding state detection unit 126A is realized by a CPU of the wireless operation terminal 100A executing a program stored in a memory.

In Step S201B of FIG. 10, a microphone unit controller 125A requests the holding state detection unit 126A to make a judgment upon receiving a microphone ON request including information that designates a gain value. In response to the request, the holding state detection unit 126A acquires acceleration values in the triaxial XYZ directions, that have been output from the acceleration sensor 112A, and calculates, for example, a combined acceleration as a movement of the wireless operation terminal 100A. The holding state detection unit 126A judges that the wireless operation terminal 100A is being held by the user when the calculated movement is a predetermined value or more and judges that the wireless operation terminal 100A is not held (e.g., wireless operation terminal 100A is placed on table) when the calculated movement is smaller than the predetermined value (Step S206B). The holding state detection unit 126A notifies the microphone unit controller 125A of the judgment result.

The microphone unit controller 125A changes the gain to be set to the amplification A/D conversion circuit 122 during when the wireless operation terminal 100A is being held and when the wireless operation terminal 100A is not held (Step S202B). For example, when a gain preset to an activated application is represented by G1, the microphone unit controller 125A 1. sets G1 to the amplification A/D conversion circuit 122 as it is in the holding state, and 2. sets G1+G2 to the amplification A/D conversion circuit 122 in the unheld state.

Here, G2 is a predetermined value.

Specifically, when the wireless operation terminal 100A is being held, a speaker can bring his/her mouth close to a microphone 121A as much as possible to speak in many cases. However, when the wireless operation terminal 100A is placed on a table or the like, there is usually a distance between the microphone 121A and the mouth of the speaker. In this regard, in the latter case, a gain larger than the preset gain G1 by G2 is set to an amplification A/D conversion circuit 122A.

Operations of Steps S203B to S205B of the wireless operation terminal 100A and Steps S103B to S105B of the operation target apparatus 200A are the same as those of the first embodiment.

According to this embodiment, an optimal gain can be set when the wireless operation terminal 100A is being held and when not held. In particular, by setting the gain to be high so as to compensate for a lowered amount of a sound pressure captured by the microphone 121A due to an increased distance between the user and the wireless operation terminal 100A when the wireless operation terminal 100A is placed on a table or the like, a more-favorable audio input becomes possible, and an audio recognition rate can be expected to be improved.

MODIFIED EXAMPLE 2

Figure 11:
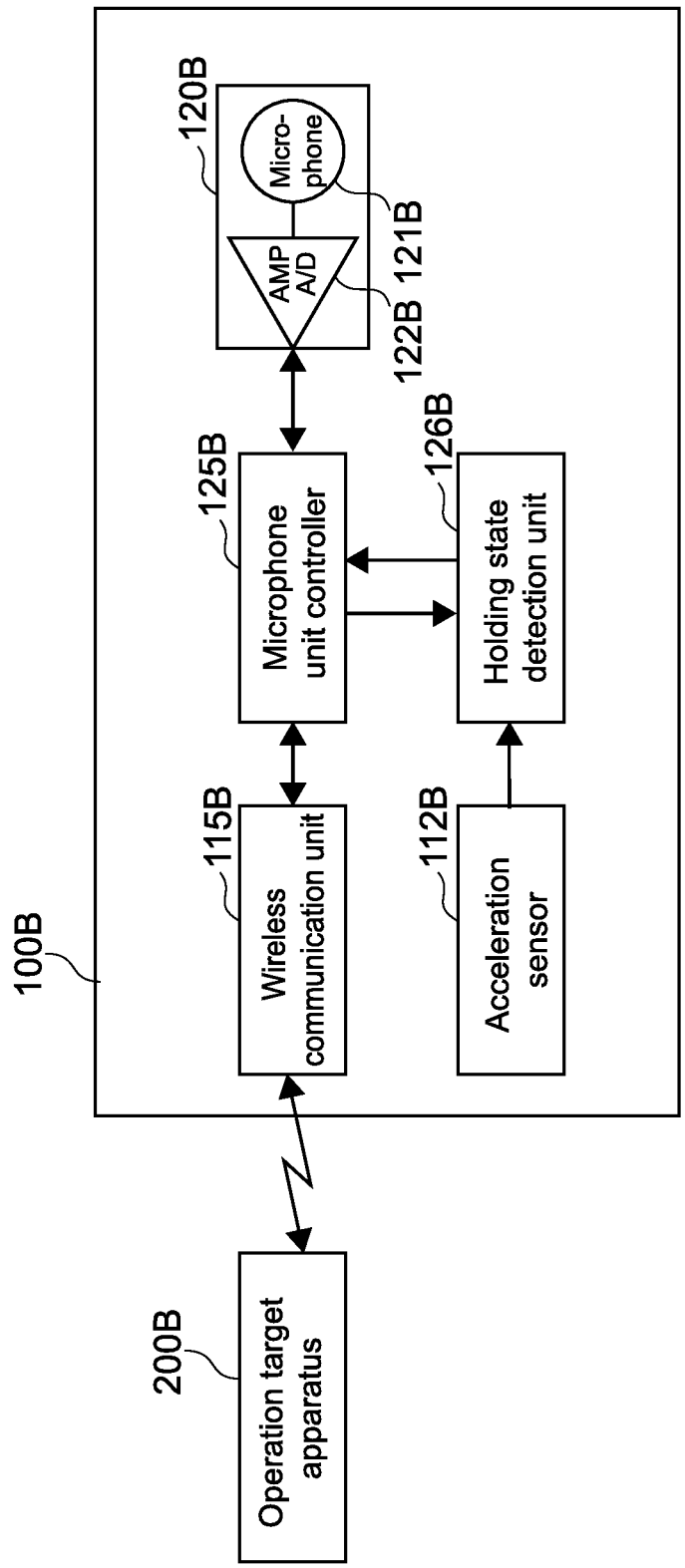
FIG. 11 is a block diagram showing a functional structure of a wireless operation terminal according to Modified Example 2.

FIG. 11 is a block diagram showing a functional structure of a wireless operation terminal 100B according to Modified Example 2.

In Modified Example 2, a switch between the gain G1 and the gain G1+G2 is allowed under the following conditions.

1. When a holding state is detected and G1 is set as the gain, a switch to G1+G2 is allowed when an audio input is practically stopped for a predetermined time or more (several seconds) and a value of a movement of the wireless operation terminal 100B (e.g., combined acceleration) becomes smaller than a predetermined value.

2. When an unheld state is detected and G1+G2 is set as the gain, a switch to G1 is allowed when an audio input is practically stopped for a predetermined time or more (several seconds) and the value of the movement of the wireless operation terminal 100B (e.g., combined acceleration) becomes a predetermined value or more.

By allowing the switch of the gain only during the period an audio input is stopped, that is, by inhibiting the gain from being switched during a period audio is input as described above, audio recognition errors due to a change of the gain in midst of the series of audio inputs can be prevented from occurring.

Furthermore, for the holding state and the unheld state to be judged more positively, it is also possible to set the conditions for allowing the switch of the gains in consideration of the fact that an acceleration higher than that in the holding state is generated temporarily when the wireless operation terminal 100B is to be placed on a table or when the wireless operation terminal 100B is to be picked up from the table.

Figure 12:
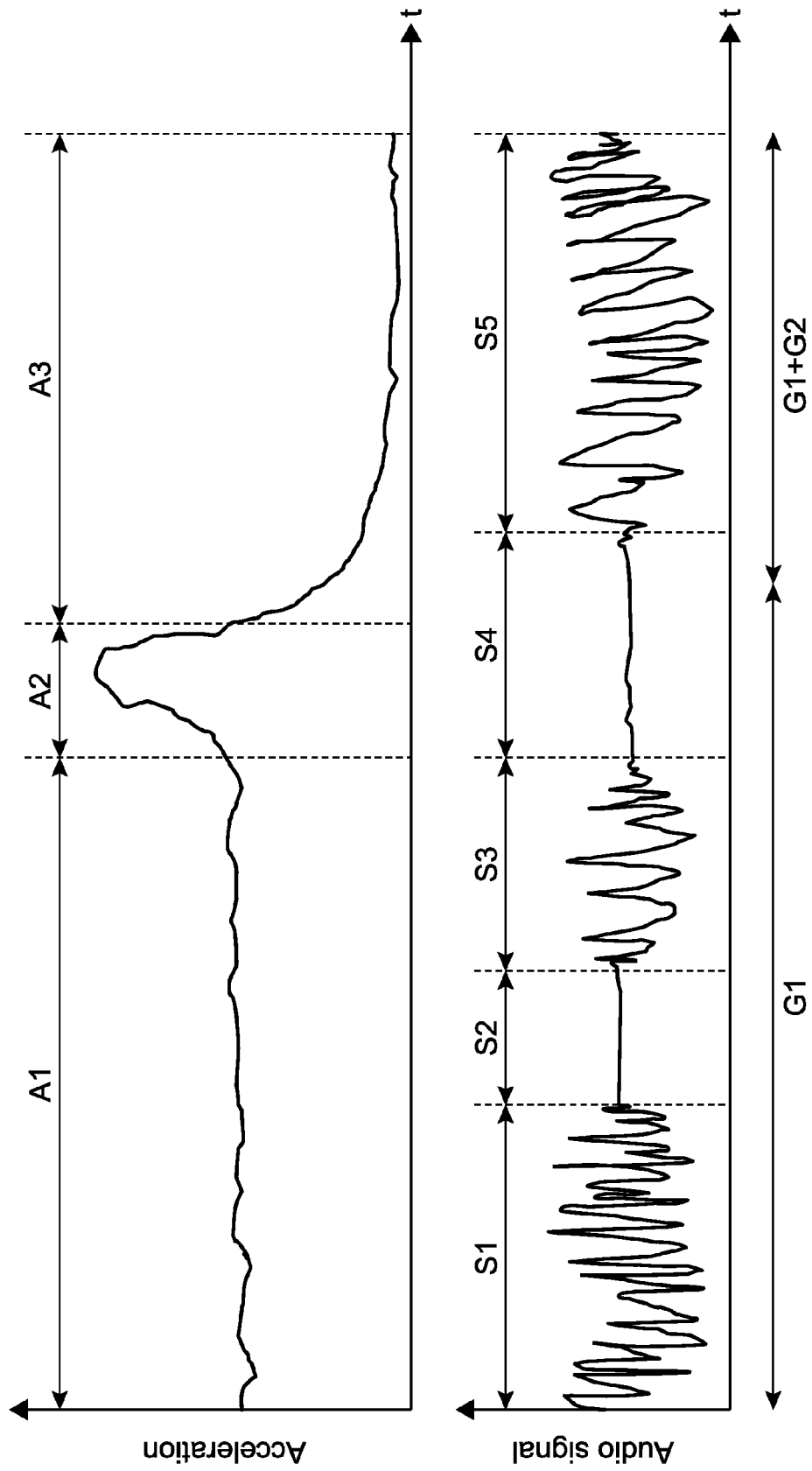
FIG. 12 is a timing chart showing an example of a relationship among an acceleration, a signal waveform of input audio, and a gain switch timing in the wireless operation terminal according to Modified Example 2.
Figure 13:
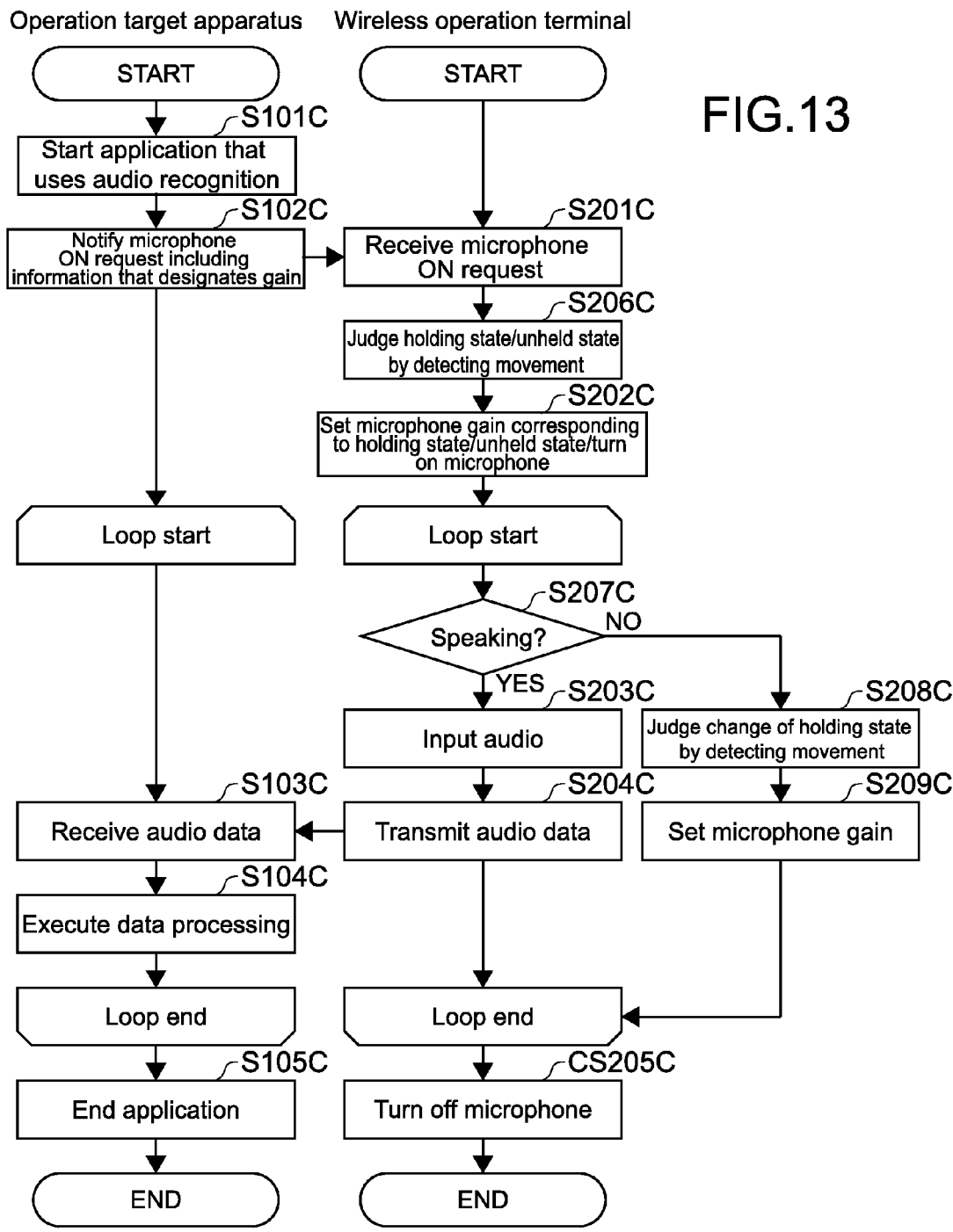
FIG. 13 is a flowchart showing operations of the wireless operation terminal and the operation target apparatus according to Modified Example 2.

FIG. 12 is a timing chart showing an example of a relationship among an acceleration, a signal waveform of input audio, and a gain switch timing in the wireless operation terminal 100B of Modified Example 2. FIG. 13 is a flowchart showing operations of the Modified Example 2 and an operation target apparatus 200B according to Modified Example 2.

In FIGS. 12, S1, S3, and S5 are periods during which input audio is generated, and S2 and S4 are periods during which there is practically no input audio. Further, A1 is a period during which the wireless operation terminal 100B is held, and A2 is a transient period during which the wireless operation terminal 100B is about to be placed on a table or the like. Moreover, A3 is a period during which the wireless operation terminal 100B is not held. Since the acceleration largely varies as compared to that in the holding state during the transient period A2, a holding state detection unit 126B shown in FIG. 11 can detect the transient period A2 by comparing a change amount of the acceleration per unit time with a predetermined threshold value.

In the flowchart shown in FIG. 13, operations of the operation target apparatus 200B from Steps S101C to S105C are the same as those of Steps S101B to S105B shown in FIG. 10. On the other hand, operations of the wireless operation terminal 100B from Steps S201C to S206C are the same as those of Steps S201B to S206B shown in FIG. 10.

In Step S207C, a microphone unit controller 125B sets a gain according to a microphone ON request from the operation target apparatus 200B and monitors a generation of input audio after that. When the input audio continuously stops for a predetermined time or more (NO in Step S207C), the microphone unit controller 125B requests the holding state detection unit 126B to detect a change between a holding state and an unheld state. The holding state detection unit 126B judges that the transient period A2 has started upon detecting a change amount of the acceleration, that is equal to or larger than the threshold value, per unit time (Step S208C) and notifies the microphone unit controller 125B that the change has occurred between the holding state and the unheld state. At this time, the holding state detection unit 126B may distinguish the change from the holding state to the unheld state and the change from the unheld state to the holding state from each other based on a magnitude relationship of the accelerations before and after the transient period A2 and notify the microphone unit controller 125B of the change. Alternatively, the holding state detection unit 126B may notify the microphone unit controller 125B of only the occurrence of a change between the holding state and the unheld state so that the microphone unit controller 125B sets a gain different from the gain set with respect to the state up to that time (e.g., G1) (e.g., G1+G2). According to the notification from the holding state detection unit 126B, the microphone unit controller 125B changes the gain to be set to the amplification A/D conversion circuit 122 (Step S209C).

As a result, the change from the holding state to the unheld state and the change from the unheld state to the holding state can be detected more positively, and optimal gains respectively corresponding to the holding state and the unheld state can be set more positively.

MODIFIED EXAMPLE 3

In the above embodiment and modified examples, the holding state and the unheld state have been detected based only on the accelerations. However, the holding state detection units 126A and 126B (second detection unit) may detect the holding state and the unheld state based on information on tilts with respect to the axial XYZ directions that are obtained based on the outputs from the acceleration sensors 112A and 112B. Alternatively, the holding state detection units 126A and 126B (second detection unit) may detect the holding state and the unheld state based on both the information on the accelerations and the information on the tilts.

MODIFIED EXAMPLE 4

Figure 14:
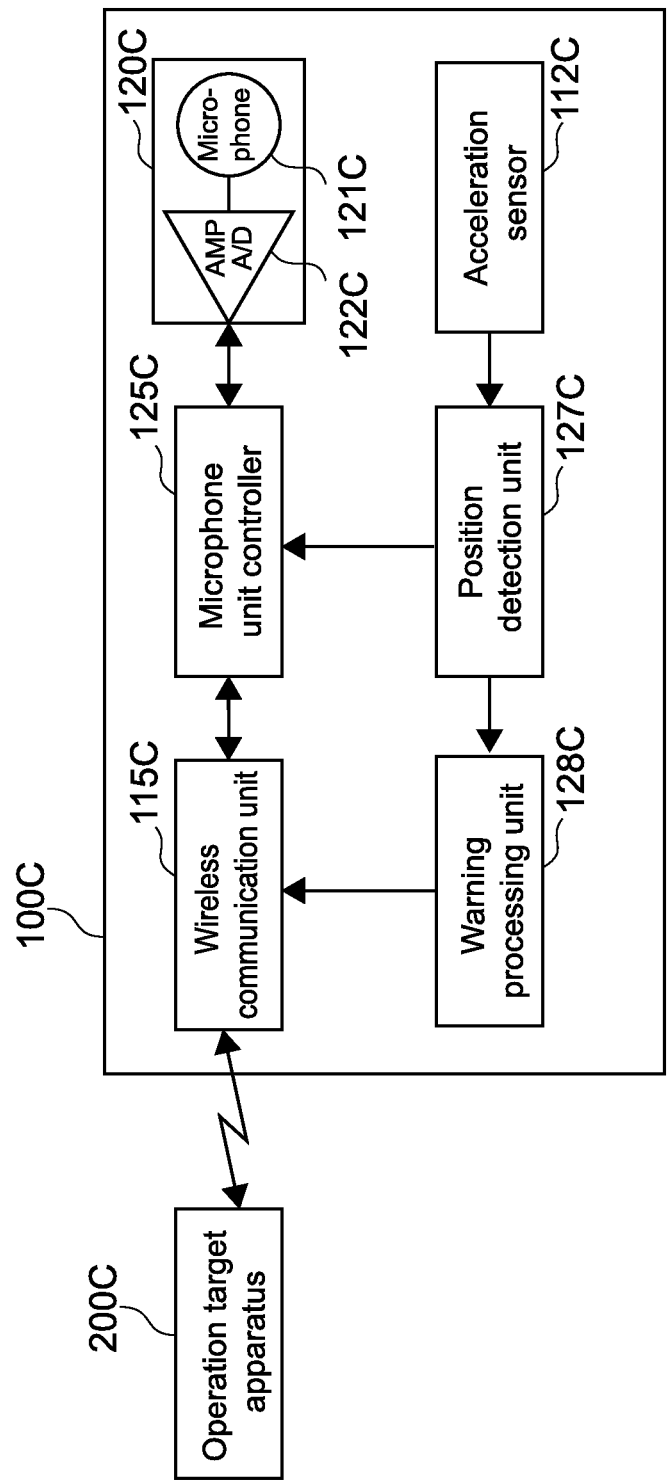
FIG. 14 is a block diagram showing a functional structure of a wireless operation terminal according to Modified Example 4.

FIG. 14 is a block diagram showing a functional structure of a wireless operation terminal 100C according to Modified Example 4.

Figure 16:
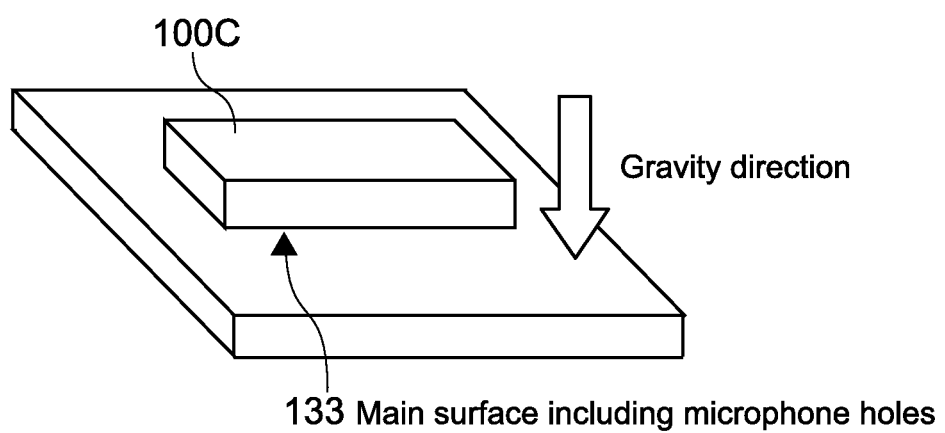
FIG. 16 is a diagram showing a setting position of a warning target of the wireless operation terminal.

The wireless operation terminal 100C includes a position detection unit (third detection unit) 127C. The position detection unit 127C detects whether a gravity direction and a direction of the main surface 133 of the outer package including the microphone holes 131 (FIG. 2) in the wireless operation terminal 100C coincide as shown in FIG. 16, and notifies a microphone unit controller 125C of the detection result. Here, the fact that the gravity direction and the direction of the main surface 133 of the outer package including the microphone holes 131 coincide means that the microphone holes 131 are blocked by a setting surface of a table or the like. In this case, the position detection unit 127C requests a warning processing unit 128C to transmit a warning. The warning processing unit 128C transmits warning information to an operation target apparatus 200C using a wireless communication unit 115C.

Figure 17:
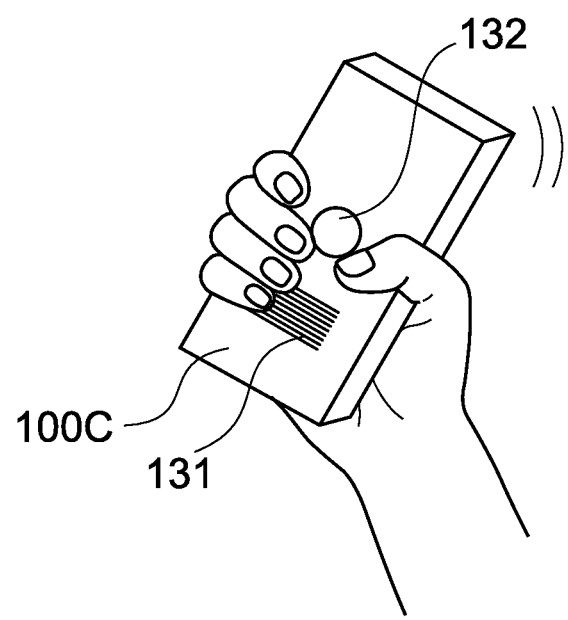
FIG. 17 is a diagram showing a holding state of the warning target of the wireless operation terminal.

Further, as shown in FIG. 17, regarding a positional relationship between the microphone holes 131 formed on the main surface 133 of the outer package of the wireless operation terminal 100C and the microphone ON button 132 in the gravity direction, the microphone holes 131 may come more on the gravity direction side than the microphone ON button 132 depending on the way the user holds the wireless operation terminal 100C. In this case, a finger of the user or the like may partially block the microphone holes 131 when the user operates the microphone ON button 132. Also in this case, the warning processing unit 128C transmits the warning information to the operation target apparatus 200C using the wireless communication unit 115C.

Figure 15:
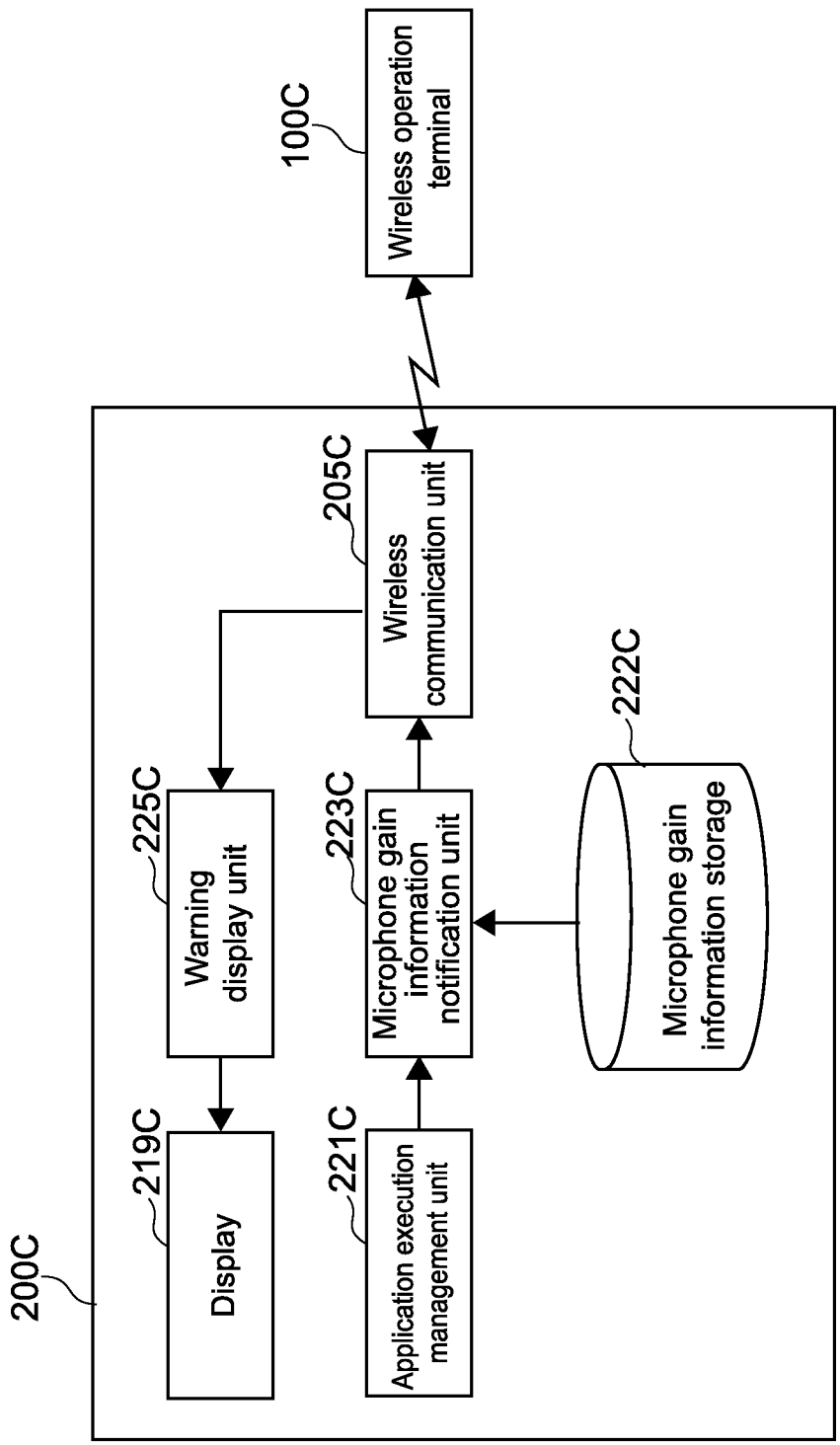
FIG. 15 is a block diagram showing a functional structure of an operation target apparatus according to Modified Example 4.

FIG. 15 is a block diagram showing a functional structure of the operation target apparatus 200C.

The operation target apparatus 200C additionally includes a warning display unit 225C. Other structures are the same as those of the operation target apparatus 200 of the first embodiment shown in FIG. 5.

Upon receiving the warning information from the wireless operation terminal 100C using a wireless communication unit 205C, the warning display unit 225C carries out processing for displaying, on a display 219C, information for warning that the position and direction of the wireless operation terminal 100C are inappropriate for an audio input and prompting the position and direction to be changed.

Figure 18:
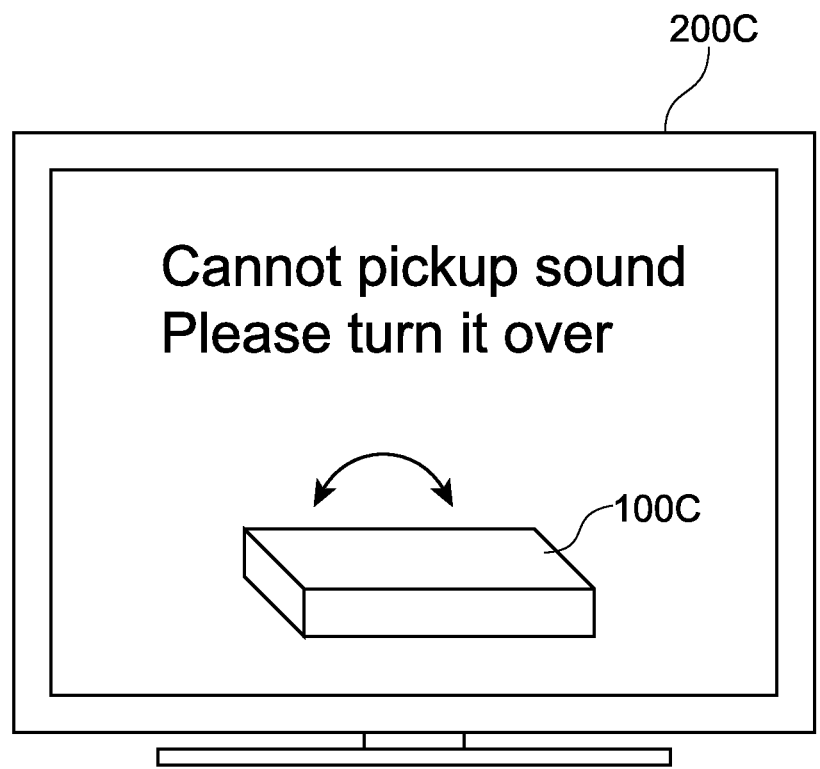
FIG. 18 is a diagram showing an example of warning display with respect to the setting position of the warning target shown in FIG. 16.
Figure 19:
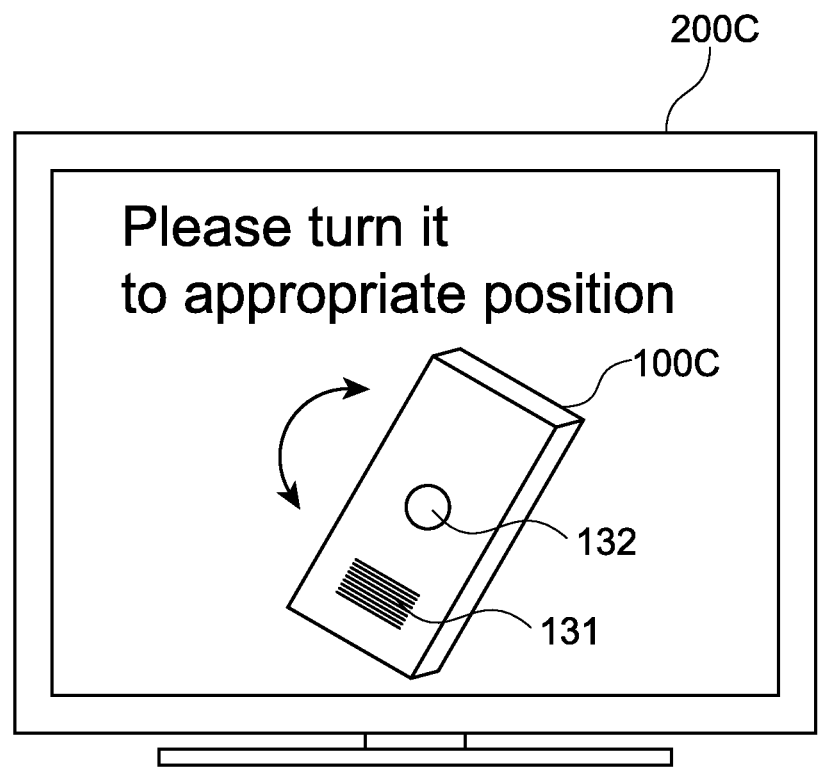
FIG. 19 is a diagram showing an example of warning display with respect to the holding state of the warning target shown in FIG. 17.

For example, when the gravity direction and the direction of the main surface 133 of the outer package including the microphone holes 131 (FIG. 2) coincide as shown in FIG. 16, the warning display unit 225C generates, based on the warning information transmitted from the warning processing unit 128C of the wireless operation terminal 100C, warning information including an image, a moving image, or a message so as to prompt the user to turn over the wireless operation terminal 100C and displays the warning information on the display 219C as shown in FIG. 18, for example.

Furthermore, when the microphone holes 131 are more on the gravity direction side than the microphone ON button 132 as shown in FIG. 17, the warning display unit 225C generates, based on the warning information transmitted from the warning processing unit 128C of the wireless operation terminal 100C, warning information including an image, a moving image, or a message so as to prompt the user to turn the wireless operation terminal 100C such that the microphone holes 131 come to the upper side and displays the warning information on the display 219C.

According to this embodiment, it is possible to detect a setting position and holding position inappropriate for an audio input by the wireless operation terminal 100C and present warning information to prompt the user to correct such a state. As a result, user operability and reliability regarding an audio input can be expected to be improved.

It should be noted that the present disclosure may also take the following structures.

(1) An information processing apparatus, including:

an audio input unit capable of converting audio into an electric audio signal;

an amplifier unit capable of performing auto gain control for amplifying the audio signal obtained by the audio input unit; and a controller configured to turn off the auto gain control of the amplifier unit when an application that uses an audio recognition is executed with respect to the amplified audio signal.

(2) The information processing apparatus according to (1), further including a first detection unit configured to detect a movement, in which the controller judges, when the auto gain control is off, whether the information processing apparatus is being held by a user based on the detected movement and sets a gain corresponding to a result of the judgment to the amplifier unit.

(3) The information processing apparatus according to (1) or (2), in which the controller sets, to the amplifier unit, a first gain as the gain when it is judged that the information processing apparatus is being held and sets a second gain larger than the first gain as the gain when it is judged that the information processing apparatus is not being held.

(4) The information processing apparatus according to any one of (1) to (3), in which the controller inhibits a switch between the first gain and the second gain during an audio input by the audio input unit.

(5) The information processing apparatus according to any one of (1) to (4), further including a transmission unit configured to transmit the amplified audio signal to an apparatus that executes the application that uses the audio recognition.

(6) The information processing apparatus according to any one of (1) to (5), in which the controller turns on the audio input unit as well as set on/off the auto gain control with respect to the amplifier unit upon receiving an instruction to activate the audio input unit from the apparatus, the instruction including information related to the gain to be set to the amplifier unit.

(7) The information processing apparatus according to (1), further including a second detection unit configured to detect a tilt, in which the controller judges, when the auto gain control is off, whether the information processing apparatus is being held by a user based on the detected tilt and sets a gain corresponding to a result of the judgment to the amplifier unit.

(8) The information processing apparatus according to (1), further including:

a cuboidal outer package that has microphone holes related to the audio input unit on one surface thereof; and a third detection unit configured to detect a relationship between a gravity direction and a direction of the surface including the microphone holes, in which the controller requests an output of a warning when it is judged by the third detection unit that the gravity direction coincides with the direction of the surface including the microphone holes while the auto gain control is off.

(9) The information processing apparatus according to (1), further including:

a cuboidal outer package in which microphone holes related to the audio input unit and an operator operated during an audio input are provided on one surface while being apart from each other in a uniaxial direction; and a fourth detection unit configured to detect a positional relationship between the microphone holes and the operator in a gravity direction, in which the controller requests an output of a warning when it is judged by the fourth detection unit that the microphone holes are located more on the gravity direction side than the operator while the auto gain control is off.

(10) The information processing apparatus according to any one of (7) to (9), in which the controller sets, to the amplifier unit, a first gain as the gain when it is judged that the information processing apparatus is being held and sets a second gain larger than the first gain as the gain when it is judged that the information processing apparatus is not being held.

(11) The information processing apparatus according to any one of (7) to (10), in which the controller inhibits a switch between the first gain and the second gain during an audio input by the audio input unit.

(12) The information processing apparatus according to any one of (7) to (11), further including a transmission unit configured to transmit the amplified audio signal to an apparatus that executes the application that uses the audio recognition.

(13) The information processing apparatus according to any one of (7) to (12), in which the controller turns on the audio input unit as well as set on/off the auto gain control with respect to the amplifier unit upon receiving an instruction to activate the audio input unit from the apparatus, the instruction including information related to the gain to be set to the amplifier unit.

It should be understood by those skilled in the art that various modifications, combinations, sub-combinations and alterations may occur depending on design requirements and other factors insofar as they are within the scope of the appended claims or the equivalents thereof.

What is claimed is:

1. An information processing apparatus, comprising:
    an audio input unit to convert audio into an electric audio signal;
    an amplifier unit that is configured to amplify the audio signal obtained by the audio input unit and to perform auto gain control;
    a controller configured to turn off the auto gain control of the amplifier unit when an application that uses an audio recognition is executed with respect to the amplified audio signal; and
    a movement detection unit configured to detect a movement of the information processing apparatus,
    the controller judges, when the auto gain control is off, whether the information processing apparatus is being held by a user based on the detected movement and sets a gain corresponding to a result of the judgment of the amplifier unit.

2. The information processing apparatus according to claim 1,
    wherein the controller sets, to the amplifier unit, a first gain as the gain when it is judged that the information processing apparatus is being held and sets a second gain larger than the first gain as the gain when it is judged that the information processing apparatus is not being held.

3. The information processing apparatus according to claim 2,
    wherein the controller inhibits a switch between the first gain and the second gain during an audio input by the audio input unit.

4. The information processing apparatus according to claim 3, further comprising
    a transmission unit configured to transmit the amplified audio signal to an apparatus that executes the application that uses the audio recognition.

5. The information processing apparatus according to claim 4,
    wherein the controller turns on the audio input unit as well as set on/off the auto gain control with respect to the amplifier unit upon receiving an instruction to activate the audio input unit from the apparatus, the instruction including information related to the gain to be set to the amplifier unit.

6. An information processing apparatus, comprising:
    an audio input unit to convert audio into an electric audio signal;
    an amplifier unit that is configured to amplify the audio signal obtained by the audio input unit and to perform auto gain control;
    a controller configured to turn off the auto gain control of the amplifier unit when an application that uses an audio recognition is executed with respect to the amplified audio signal; and
    a tilt detection unit configured to detect a tilt of the information processing apparatus,
    the controller judges, when the auto gain control is off, whether the information processing apparatus is being held by a user based on the detected tilt and sets a gain corresponding to a result of the judgment to the amplifier unit.

7. An information processing apparatus, comprising:
    an audio input unit to convert audio into an electric audio signal;
    an amplifier unit that is configured to amplify the audio signal obtained by the audio input unit and to perform auto gain control;
    a controller configured to turn off the auto gain control of the amplifier unit when an application that uses an audio recognition is executed with respect to the amplified audio signal;
    a cuboidal outer package that has microphone holes related to the audio input unit on one surface thereof; and
    a relationship detection configured to detect a relationship between a gravity direction and a direction of the surface including the microphone holes,
    the controller requests an output of a warning when it is judged by the relationship detection unit that the gravity direction coincides with the direction of the surface including the microphone holes while the auto gain control is off.

8. An information processing apparatus, comprising:
    an audio input unit to convert audio into an electric audio signal;
    an amplifier unit that is configured to amplify the audio signal obtained by the audio input-output and to perform auto gain control;
    a controller configured to turn off the auto gain control of the amplifier unit when an application that uses an audio recognition is executed with respect to the amplified audio signal;
    a cuboidal outer package in which microphone holes related to the audio input unit and an operator operated during an audio input are provided on one surface while being apart from each other in a uniaxial direction; and
    a positional relationship detection unit configured to detect a positional relationship between the microphone holes and the operator in a gravity direction,
    the controller requests an output of a warning when it is judged by the positional relationship detection unit that the microphone holes are located more on the gravity direction side than the operator while the auto gain control is off.

* * * * *